United States Patent
Yamada (10) Patent No.: US 12,457,776 B2
(45) Date of Patent: Oct. 28, 2025

(54) ISOLATOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masaki Yamada, Oita Oita (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 912 days.

(21) Appl. No.: 17/554,772

(22) Filed: Dec. 17, 2021

(65) Prior Publication Data
US 2022/0336580 A1    Oct. 20, 2022

(30) Foreign Application Priority Data

Apr. 20, 2021    (JP) ................. 2021-070841

(51) Int. Cl.
H01F 27/28    (2006.01)
H01F 27/29    (2006.01)
(Continued)

(52) U.S. Cl.
CPC .......... *H10D 62/115* (2025.01); *H01F 27/29* (2013.01); *H01F 27/323* (2013.01)

(58) Field of Classification Search
CPC ..... H10D 62/115; H01F 27/29; H01F 27/323; H01F 27/324; H01L 21/76802;
(Continued)

(56) References Cited

U.S. PATENT DOCUMENTS 6,417,575 B2    7/2002   Harada et al.
6,429,105 B1    8/2002   Kunikiyo
(Continued)

FOREIGN PATENT DOCUMENTS

CN    1941395 A    4/2007
CN    102165576 A    8/2011
(Continued)

OTHER PUBLICATIONS

Notice of Reasons for Refusal (Office Action) mailed Aug. 16, 2024 in Japanese Patent Application No. 2021-070841 with English machine translation, 6 pages.
(Continued)

*Primary Examiner* — Shawki S Ismail
*Assistant Examiner* — Kazi S Hossain
(74) *Attorney, Agent, or Firm* — Kim & Stewart LLP (57) ABSTRACT

An isolator includes first and second conductors, and first to third insulating film. The first insulating film is provided between the first and second conductors. The first insulating film has a first film thickness, and includes silicon, oxygen, and nitrogen. The second insulating film is provided between the first conductor and the first insulating film. The second insulating film includes silicon and oxygen. The second insulating film includes no nitrogen, or further includes nitrogen of a smaller composition ratio than a nitrogen composition ratio in the first insulating film. The third insulating film is provided between the first conductor and the second insulating film. The second and third insulating films has second and third film thicknesses, respectively. The second and third film thickness are less than the first film thickness. The third insulating film having a different composition from the compositions of the first and second insulating films.

7 Claims, 6 Drawing Sheets

(51) Int. Cl.
  *H01F 27/32* (2006.01)
  *H10D 62/10* (2025.01)
(58) Field of Classification Search
  CPC ........... H01L 23/5227; H01L 23/53295; H01L 23/5223; H01L 23/645
  USPC ........................................ 336/206, 200, 232
  See application file for complete search history.

(56) References Cited

U.S. PATENT DOCUMENTS

| | | |
|---|---|---|
| 6,504,227 B1 | 1/2003 | Matsuo et al. |
| 2007/0075382 A1 | 4/2007 | Yamaguchi et al. |
| 2008/0203509 A1 | 8/2008 | Mishima et al. |
| 2011/0175193 A1 | 7/2011 | Nakagawa |
| 2015/0137314 A1 | 5/2015 | Osada et al. |
| 2016/0093499 A1 | 3/2016 | Yamabe et al. |
| 2020/0035654 A1* | 1/2020 | Chen ........................ H01L 24/20 |
| 2020/0203058 A1* | 6/2020 | Osada ................. H01F 27/2804 |
| 2020/0294786 A1* | 9/2020 | Yamada .............. H01L 21/0217 |
| 2020/0294941 A1* | 9/2020 | Naito ................. H01L 23/5225 |
| 2021/0083908 A1 | 3/2021 | Ohguro et al. |
| 2021/0305115 A1* | 9/2021 | Choi ................. H01L 23/53295 |

FOREIGN PATENT DOCUMENTS

| | | |
|---|---|---|
| CN | 105470203 A | 4/2016 |
| CN | 112531011 A | 3/2021 |
| JP | 2001-196373 A | 7/2001 |
| JP | 2010-123904 A | 6/2010 |
| JP | 2011-238951 A | 11/2011 |
| JP | 2012-134545 A | 7/2012 |
| JP | 5023413 B2 | 9/2012 |
| JP | 5389208 B2 | 1/2014 |
| JP | 2016-028407 A | 2/2016 |
| JP | 2016152343 A | 8/2016 |
| JP | 2020-150241 A | 9/2020 |

OTHER PUBLICATIONS

First Office Action mailed Mar. 21, 2025 in corresponding Chinese Patent Application No. 202210048378.3, with English machine translation, 12 pages.
Second Office Action mailed Aug. 15, 2025 in counterpart Chinese Patent Application No. 202210048378.3, with English machine translation, 16 pages.

* cited by examiner

ISOLATOR

CROSS-REFERENCE TO RELATED APPLICATIONS

This application is based upon and claims the benefit of priority from Japanese Patent Application No. 2021-070841, filed on Apr. 20, 2021; the entire contents of which are incorporated herein by reference.

FIELD

Embodiments relate to an isolator.

BACKGROUND

An isolator transmits a signal between two magnetically-coupled coils. Such an isolator, for example, maintains a desired breakdown voltage between the two coils by providing a thick insulating film therebetween to prevent dielectric breakdown. When the insulating film is made thick, however, the internal stress increases, and warp occurs in the wafer on which the insulating film is formed. Therefore, trouble may occur in the manufacturing processes of the isolator.

BRIEF DESCRIPTION OF THE DRAWINGS

FIGS. 3A to 4C are cross-sectional views illustrating a portion of manufacturing processes of the isolator according to the first embodiment;

DETAILED DESCRIPTION

An isolator includes first and second conductors, and first to third insulating film. The second conductor faces the first conductor. The first insulating film is provided between the first conductor and the second conductor. The first insulating film has a first film thickness in a first direction directed from the first conductor toward the second conductor. The first insulating film includes silicon, oxygen, and nitrogen. The second insulating film is provided between the first conductor and the first insulating film. The second insulating film has a second film thickness in the first direction, the second film thickness being less than the first film thickness of the first insulating film. The second insulating film includes silicon and oxygen. The second insulating film includes no nitrogen, or the second insulating film further includes nitrogen of a smaller composition ratio than a nitrogen composition ratio in the first insulating film. The third insulating film is provided between the first conductor and the second insulating film. The third insulating film has a third film thickness in the first direction, the third film thickness being less than the first film thickness of the first insulating film. The third insulating film having a different composition from the compositions of the first and second insulating films.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
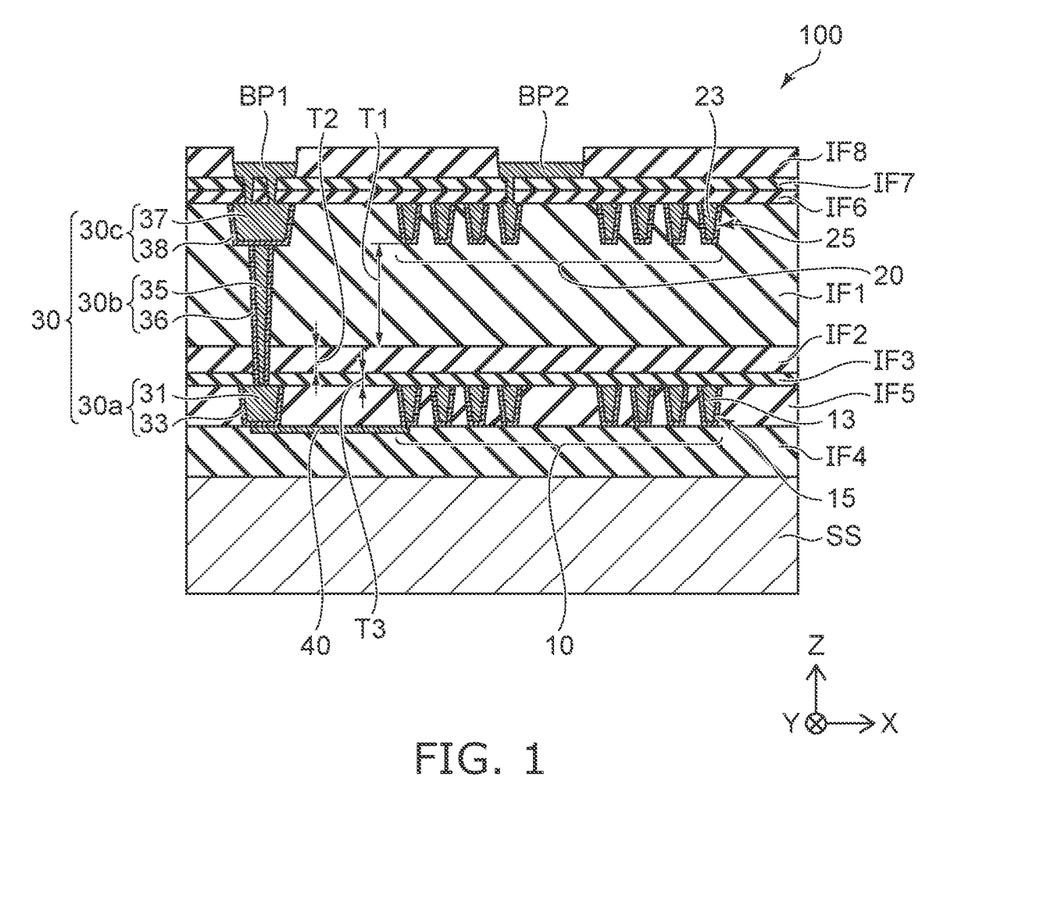
FIG. 1 is a schematic cross-sectional view illustrating an isolator according to a first embodiment.

FIG. 1 is a schematic cross-sectional view illustrating an isolator 100 according to a first embodiment. For example, the embodiment relates to a device called a digital isolator, a galvanic isolator, or a galvanic isolation element.

As shown in FIG. 1, the isolator 100 according to the first embodiment includes a substrate SS, a first conductor 10, a second conductor 20, a third conductor 30, connection wiring 40, a first insulating film IF1, a second insulating film IF2, a third insulating film IF3, a fourth insulating film IF4, a fifth insulating film IF5, a sixth insulating film IF6, a seventh insulating film IF7, an eighth insulating film IF8, a first bonding pad BP1, and a second bonding pad BP2.

The substrate SS is, for example, a silicon substrate. The substrate SS may be conductive or may be an insulating substrate.

The first conductor 10 and the second conductor 20 are provided above the substrate SS. For example, the substrate SS, the first conductor 10, and the second conductor 20 are arranged in a Z-direction. The first conductor 10 faces the second conductor 20. The first conductor 10 is provided between the substrate SS and the second conductor 20.

The first conductor 10 and the second conductor 20 are, for example, planar coils. For example, the first conductor 10 and the second conductor 20 each have spiral shapes in planes parallel to the X-Y plane. The first conductor 10 and the second conductor 20 face each other in the Z-direction and are magnetically coupled to each other.

For example, the third conductor 30 is provided outward of the first and second conductors 10 and 20 in a plane parallel to the X-Y plane. The connection wiring 40 electrically connects the first conductor 10 and the third conductor 30. The first conductor 10 is electrically connected to, for example, a peripheral circuit or a peripheral potential via the third conductor 30 and the connection wiring 40. The second conductor 20 is connected to, for example, an external circuit or an external potential.

The first insulating film IF1 is provided between the first conductor 10 and the second conductor 20. The first insulating film IF1 includes, for example, silicon (Si), oxygen (O), and nitrogen (N). The first insulating film IF1 is, for example, a silicon oxynitride film (SiON).

The second insulating film IF2 is provided between the first conductor 10 and the first insulating film IF1. The second insulating film IF2 includes, for example, silicon (Si) and oxygen (O). The second insulating film IF2 may not include nitrogen, or may further include nitrogen of a smaller nitrogen composition ratio than the first insulating film IF1. For example, the relative dielectric constant of the second insulating film IF2 is less than the relative dielectric constant of the first insulating film IF1. The second insulating film IF2 is, for example, a silicon oxide film ($SiO_2$).

The third insulating film IF3 is provided between the first conductor 10 and the second insulating film IF2. The third insulating film IF3 includes a different composition from the first and second insulating films IF1 and IF2. The third insulating film IF3 includes, for example, silicon (Si) and nitrogen (N). For example, the relative dielectric constant of the third insulating film IF3 is greater than the relative dielectric constant of the first insulating film IF1 and the relative dielectric constant of the second insulating film IF2. The third insulating film IF3 is, for example, a silicon nitride film (SiN). Although the third insulating film IF3 may be a silicon oxynitride film (SiON), the nitrogen composition ratio in the third insulating film IF3 is greater than the nitrogen composition ratio in the first insulating film IF1. In another example, the third insulating film IF3 may be a silicon carbide film (SiC) or a silicon carbonitride film (SiCN).

The fourth insulating film IF4 is provided between the substrate SS and the first conductor 10. The fourth insulating film IF4 electrically insulates the first conductor 10 from the substrate SS. The fourth insulating film IF4 is, for example, a silicon oxide film.

The fifth insulating film IF5 is provided between the fourth insulating film IF4 and the third insulating film IF3. The fifth insulating film IF5 is, for example, a silicon oxide film. The first conductor 10 is provided in the fifth insulating film IF5 and contacts the third insulating film IF3. For example, the third insulating film IF3 has a composition that does not include oxygen so that the first conductor 10 is not oxidized.

The sixth insulating film IF6 is provided on the first insulating film IF1. The sixth insulating film IF6 is, for example, a silicon nitride film.

The second conductor 20 is provided between the first insulating film IF1 and the sixth insulating film IF6; the second conductor 20 is provided in, for example, the first insulating film IF1 and contacts the sixth insulating film IF6. For example, the sixth insulating film IF6 has a composition that does not include oxygen so that the second conductor 20 is not oxidized.

The seventh insulating film IF7 is provided on the sixth insulating film IF6. The seventh insulating film IF7 is, for example, a silicon oxide film.

The eighth insulating film IF8 is provided on the seventh insulating film IF7. The eighth insulating film IF8 includes, for example, resin such as polyimide, etc. The eighth insulating film IF8 surrounds the first bonding pad BP1 and the second bonding pad BP2 on the seventh insulating film IF7.

The first bonding pad BP1 is provided on the seventh insulating film IF7 and is electrically connected to the third conductor 30 via a contact hole provided in the sixth and seventh insulating films IF6 and IF7. The first bonding pad BP1 includes, for example, copper (Cu) or aluminum (Al).

The second bonding pad BP2 is provided on the seventh insulating film IF7 and is electrically connected to the second conductor 20 via a contact hole provided in the sixth and seventh insulating films IF6 and IF7. The second bonding pad BP2 includes, for example, gold (Cu) and aluminum (Al).

As shown in FIG. 1, the first conductor 10 includes, for example, a metal core 13 and a barrier layer 15. The metal core 13 includes, for example, copper (Cu). The barrier layer 15 includes, for example, tantalum (Ta) or tantalum nitride (TaN). For example, the barrier layer 15 is provided between the metal core 13 and the fourth insulating film IF4 and between the metal core 13 and the fifth insulating film IF5. The barrier layer 15 prevents the diffusion of metal atoms from the metal core 13 into the fourth and fifth insulating films IF4 and IF5.

The second conductor 20 includes, for example, a metal core 23 and a barrier layer 25. The metal core 23 includes, for example, copper (Cu). For example, the barrier layer 25 is provided between the metal core 23 and the first insulating film IF1. The barrier layer 25, for example, contacts the first insulating film IF1. The barrier layer 25 includes, for example, tantalum (Ta) or tantalum nitride (TaN). The barrier layer 25 prevents the diffusion of metal atoms from the metal core 23 into the first insulating film IF1.

The third conductor 30 includes a first portion 30a, a second portion 30b, and a third portion 30c. The first portion 30a, the second portion 30b, and the third portion 30c are arranged in the Z-direction. The second portion 30b is provided between the first portion 30a and the third portion 30c and electrically connects the first portion 30a and the third portion 30c. The third portion 30c is provided at the same level as the second conductor 20 in the Z-direction.

The first portion 30a of the third conductor 30 is provided at the same level as the first conductor 10 in the Z-direction. In other words, the first portion 30a is provided in the fifth insulating film IF5. For example, the first portion 30a of the third conductor 30 is simultaneously formed with the first conductor 10 and includes a metal core 31 and a barrier layer 33. For example, the barrier layer 33 is provided between the metal core 31 and the fourth insulating film IF4 and between the metal core 31 and the fifth insulating film IF5. The barrier layer 33 prevents the diffusion of metal atoms from the metal core 31 into the fourth and fifth insulating films IF4 and IF5.

The second portion 30b of the third conductor 30 extends through the first, second, and third insulating films IF1, IF2, and IF3 in the −Z direction (the opposite direction of the Z-direction) and is connected to the first portion 30a.

The second portion 30b includes a metal core 35 and a barrier layer 36. The metal core 35 includes, for example, copper (Cu). The barrier layer 36 includes, for example, tantalum (Ta) or tantalum nitride (TaN). For example, the barrier layer 36 is provided between the metal core 35 and the first insulating film IF1, between the metal core 35 and the second insulating film IF2, between the metal core 35 and the third insulating film IF3, and between the metal core 35 and the first portion 30a. The barrier layer 36, for example, prevents the diffusion of metal atoms from the metal core 35 into the first, second, and third insulating films IF1, IF2, and IF3.

The third portion 30c of the third conductor 30 is provided at the same level as the second conductor 20 in the Z-direction. In other words, the third portion 30c is provided in the first insulating film IF1 and contacts the sixth insulating film IF6. For example, the third portion 30c is simultaneously formed with the second conductor 20 and includes a metal core 37 and a barrier layer 38. For example, the barrier layer 38 is provided between the metal core 37 and the first insulating film IF1 and between the metal core 37 and the second portion 30b. The barrier layer 38 prevents the diffusion of metal atoms from the metal core 37 into the first insulating film IF1.

The third portion 30c is connected to the second portion 30b. Also, the third portion 30c is electrically connected to the first bonding pad BP1.

The connection wiring 40 is provided between the fourth insulating film IF4 and the fifth insulating film IF5. The connection wiring 40 includes, for example, copper (Cu). The connection wiring 40 is connected to the lower surface of the first portion 30a of the third conductor 30 and the lower surface of a portion of the first conductor 10 positioned at the outermost perimeter.

In the isolator 100 according to the embodiment, the second conductor 20 is electrically insulated from the first conductor 10 by the first, second, and third insulating films IF1, IF2, and IF3. For example, between the second conductor 20 and the second insulating film IF2, the first insulating film IF1 has a first film thickness T1 in the Z-direction. The second insulating film IF2 has a second film thickness T2 in the Z-direction. The third insulating film IF3 has a third film thickness T3 in the Z-direction.

The breakdown voltage between the first conductor 10 and the second conductor 20 is determined by the total thickness (T1+T2+T3) of the first, second, and third insulating films IF1, IF2, and IF3. In other words, the breakdown voltage between the first conductor 10 and the second conductor 20 can be increased by increasing the total thickness (T1+T2+T3). The total thickness of the first, second, and third insulating films IF1, IF2, and IF3 is preferably not less than 5 micrometers (µm). More preferably, the total thickness is not less than 8 µm.

When the substrate SS is a silicon substrate; the first and second insulating films IF1 and IF2 is silicon oxide films; and the first insulating film IF1 and the second insulating film IF2 have thicknesses such that the total thickness (T1+T2+T3) is not less than 5 µm, for example, the internal stress of the first and second insulating films IF1 and IF2 increases and warp occurs in the substrate SS. In such a case, there may be disadvantages in the automatic wafer transfer or the like in the manufacturing processes of the isolator 100.

The stress in the first insulating film IF1 can be reduced and the warp of the wafer can be suppressed in the manufacturing processes of the isolator 100 by using, for example, a silicon oxynitride film (SiON) as the first insulating film IF1. In other words, the stress in the first insulating film IF1 can be reduced by using a silicon oxynitride film instead of a silicon oxide film, of which the nitrogen composition ratio is controlled appropriately.

The first film thickness T1 of the first insulating film IF1 is greater than the second film thickness T2 of the second insulating film IF2. The first film thickness T1 of the first insulating film IF1 is greater than the third film thickness T3 of the third insulating film IF3. In other words, by making the first film thickness T1 of the first insulating film IF1 thick, the desired breakdown voltage can be obtained between the first conductor 10 and the second conductor 20 while suppressing the warp of the wafer.

Figure 2:
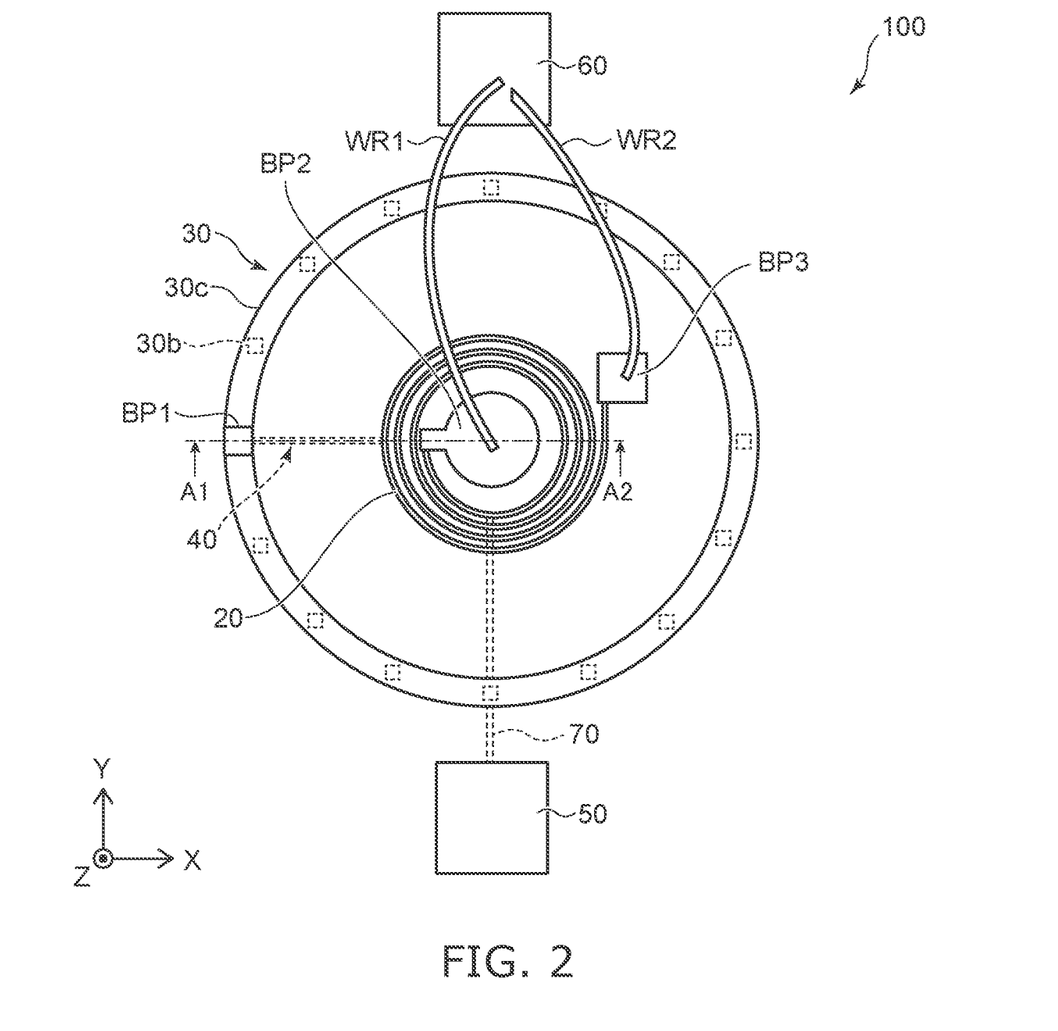
FIG. 2 is a schematic plan view illustrating the isolator according to the first embodiment.

FIG. 2 is a schematic plan view illustrating the isolator 100 according to the first embodiment. FIG. 2 illustrates the upper surface of the isolator 100 without the sixth insulating film IF6, the seventh insulating film IF7, and the eighth insulating film IF8. FIG. 1 is a cross-sectional view along line A1-A2 in FIG. 2.

As shown in FIG. 2, the isolator 100 further includes a first circuit 50, a second circuit 60, a connection wiring 70, and a third bonding pad BP3. The first circuit 50 is electrically connected to the first conductor 10. The second circuit 60 is electrically connected to the second conductor 20.

One of the first circuit 50 or the second circuit 60 is used as, for example, a transmitting circuit. The other of the first circuit 50 or the second circuit 60 is used as, for example, a receiving circuit. In the following description, the first circuit 50 is the transmitting circuit, and the second circuit 60 is the receiving circuit.

The first circuit 50 is electrically connected to one end of the first conductor 10 that is the planar coil. The first circuit 50 is electrically connected via the connection wiring 70 to the first conductor 10 that is positioned under the second conductor 20. The other end of the first conductor 10 is electrically connected to the third conductor 30 via the connection wiring 40 (referring to FIG. 1).

The second circuit 60 is electrically connected via a first metal wire WR1 and the second bonding pad BP2 to one end of the second conductor 20 that is the planar coil. Also, the second circuit 60 is electrically connected to the other end of the second conductor 20 via a second metal wire WR2 and the third bonding pad BP3.

The third bonding pad BP3, for example, is provided on the seventh insulating film IF7 and is provided on the other end of the second conductor 20. Similar to the second bonding pad BP2 (referring to FIG. 1), the third bonding pad BP3 is electrically connected to the other end of the second conductor 20 via a contact hole (not illustrated) provided in the sixth and seventh insulating films IF6 and IF7.

As shown in FIG. 2, the first bonding pad BP1 is provided on the third conductor 30. The third conductor 30, for example, is electrically connected to an external circuit (not illustrated) or a reference potential via a metal wire (not illustrated) that is bonded on the first bonding pad BP1. Alternatively, the first portion 30a of the third conductor 30 may be connected to a first reference potential, for example, without using a metal wire on the first bonding pad BP1. The first reference potential is, for example, a first ground potential.

The first circuit 50, for example, is provided on the substrate SS and electrically connected to the first conductor 10. The first circuit 50 includes, for example, multiple transistors (not illustrated) that are provided between the substrate SS and the fourth insulating film IF4, and wiring (not illustrated) that is provided in the fourth insulating film IF4.

For example, the first circuit 50 transmits a signal current to the first conductor 10. The signal current is suited to the transmission via the magnetic coupling between the first conductor 10 and the second conductor 20. In other words, an induced current that corresponds to the magnetic field change of the first conductor 10 is generated in the second conductor 20; and the induced current flows between the second conductor 20 and the second circuit 60. The second circuit 60 detects the current flowing in the second conductor 20 and generates a signal corresponding to the detection result. Thereby, the signal can be transmitted between the first conductor 10 and the second conductor 20.

The second circuit 60 is provided on another substrate (not illustrated) and has a second ground potential that is different from that of the first circuit 50 provided on the substrate SS.

The isolator 100 may include one of the first circuit 50 or the second circuit 60. The isolator 100 may be provided independently. That is, there may be a case in which the first circuit 50, the second circuit 60, and the pair of the first and second conductors 10 and 20 shown in FIG. 2 are provided on separate substrates, respectively, and are electrically insulated from each other, and in which the signal is transmitted and received between the first circuit 50 and the second circuit 60 via the magnetically-coupled pair of the first and second conductors 10 and 20.

The isolator 100 can act independently, and multiple isolators 100 connected in series can act as a doubly-insulated isolator.

The third conductor 30 surrounds the first conductor 10 and the second conductor 20 along the X-Y plane. The first portion 30a of the third conductor 30 (referring to FIG. 1) surrounds the first conductor 10 along a plane parallel to the X-Y plane. The third portion 30c of the third conductor 30 surrounds the second conductor 20 along the X-Y plane.

The second portion 30b of the third conductor 30 is provided on the first portion 30a. Multiple second portions 30b are arranged along the first portion 30a. The second portions 30b each extend in the Z-direction. The lower ends of the second portions 30b are connected to the first portion 30a; and the upper ends of the second portions 30b are connected to the third portion 30c (referring to FIG. 1).

A method for manufacturing the isolator 100 according to the first embodiment will now be described with reference to FIGS. 3A to 4C. FIGS. 3A to 4C are cross-sectional views illustrating a portion of the manufacturing processes of the isolator 100. FIGS. 3A to 4C are schematic views corresponding to a cross section along line A1-A2 in FIG. 2.

Figure 3A:
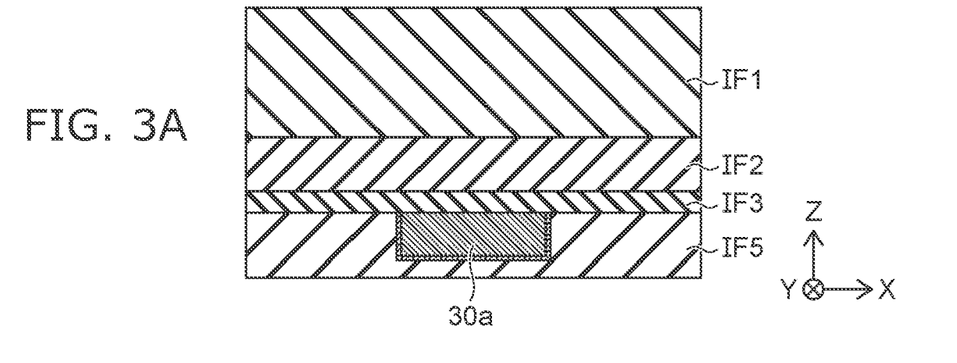

As shown in FIG. 3A, the first portion 30a of the third conductor 30 is formed in the fifth insulating film IF5. Also, the first conductor 10 is formed in the fifth insulating film IF5 at a not-illustrated portion. The third insulating film IF3, the second insulating film IF2, and the first insulating film IF1 are formed in this order on the fifth insulating film IF5.

The first insulating film IF1, the second insulating film IF2, and the third insulating film IF3 are formed using, for example, plasma CVD (Plasma enhanced Chemical Vapor Deposition). The first insulating film IF1 is, for example, a silicon oxynitride film. The second insulating film IF2 is, for example, a silicon oxide film. The third insulating film IF3 is, for example, a silicon nitride film.

Figure 3B:
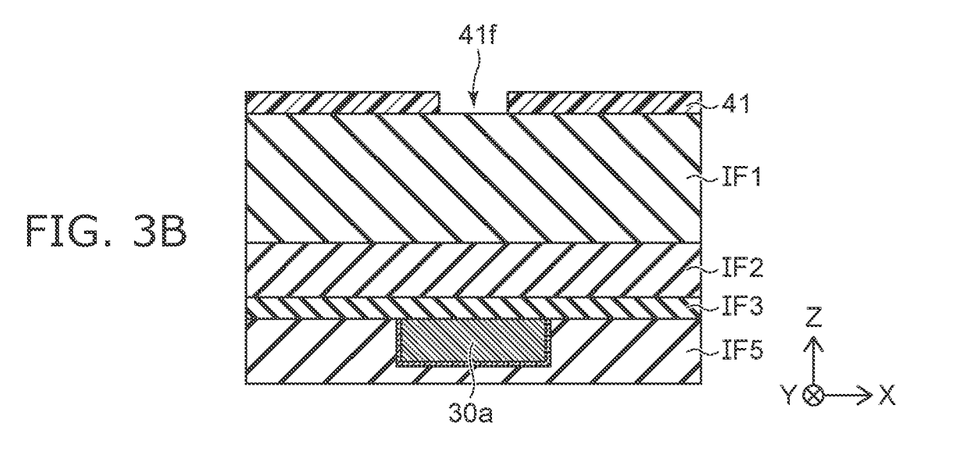

As shown in FIG. 3B, an etching mask 41 is formed on the first insulating film IF1. The etching mask 41 includes an opening 41f positioned above the first portion 30a of the third conductor 30. The etching mask 41 is, for example, a photoresist.

Figure 3C:
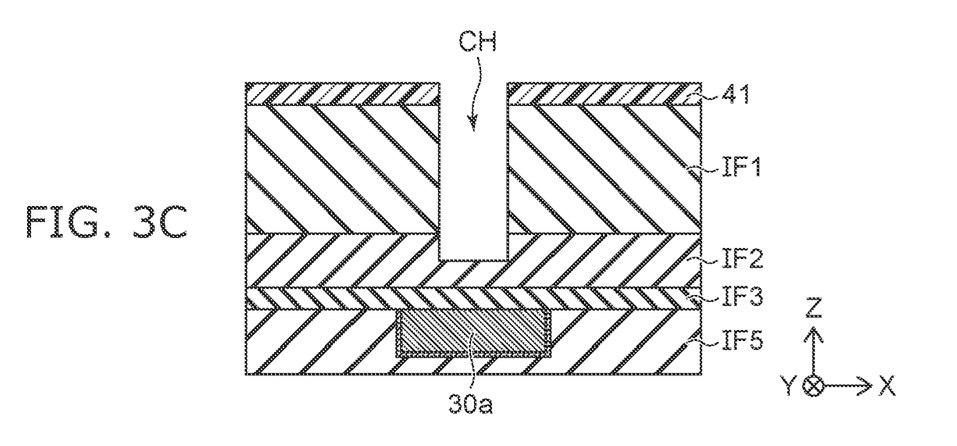

As shown in FIG. 3C, the etching mask 41 is used to form a contact hole CH by selectively removing the first insulating film IF1. For example, the first insulating film IF1 is removed using RIE (Reactive Ion Etching). The first insulating film IF1, for example, is etched under conditions such that the etching rate of a silicon oxynitride film is at least several times the etching rate of a silicon oxide film. Thereby, it is possible to control the etching time so that the etching stops at the timing when the bottom surface of the contact hole CH reaches the interior of the second insulating film IF2.

Figure 4A:
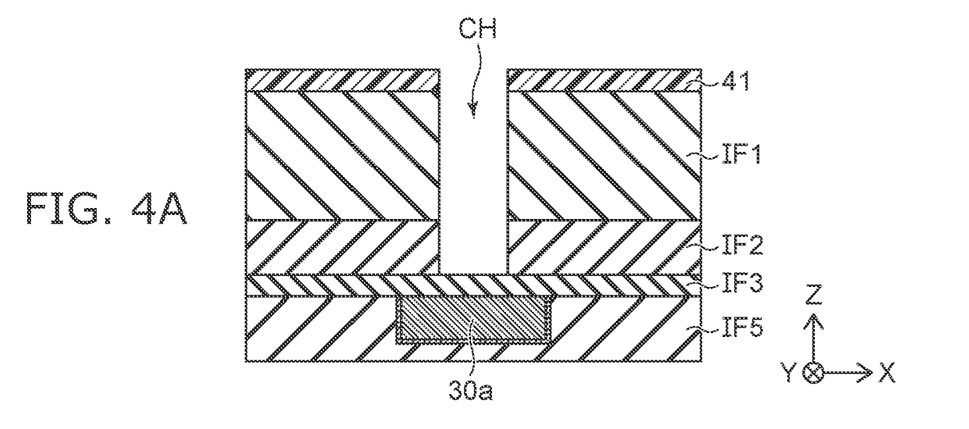

As shown in FIG. 4A, the remainder of the second insulating film IF2 is removed; and the third insulating film IF3 is exposed at the bottom surface of the contact hole CH. The etching mask 41, for example, is used to selectively remove the second insulating film IF2 by RIE. The second insulating film IF2 is etched, for example, under conditions such that the etching rate of a silicon oxide film is greater than 10 times the etching rate of a silicon nitride film.

Figure 4B:
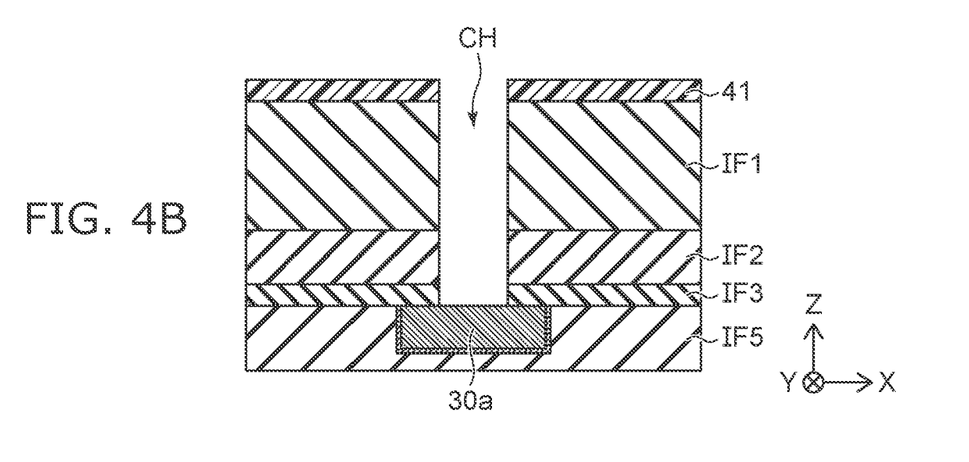

As shown in FIG. 4B, the third insulating film IF3 is selectively removed; and the first portion 30a of the third conductor 30 is exposed at the bottom surface of the contact hole CH. The etching mask 41, for example, is used to selectively remove the third insulating film IF3 by RIE.

Figure 4C:
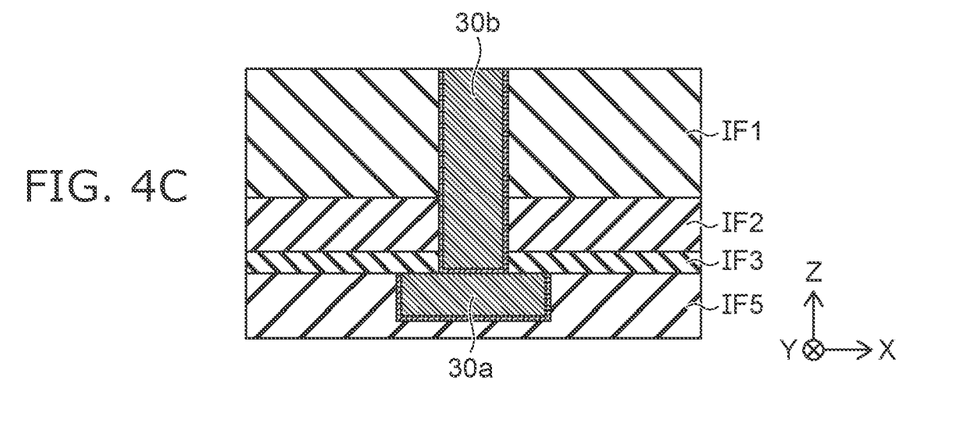

As shown in FIG. 4C, the second portion 30b of the third conductor 30 is formed inside the contact hole CH after removing the etching mask 41. The second portion 30b is formed to be electrically connected to the first portion 30a. The second portion 30b, for example, is formed by using reactive sputtering and Cu plating. The reactive sputtering is use to form tantalum nitride (TaN) that covers the inner surface of the contact hole CH, and the interior of the contact hole CH is filled by using the Cu plating.

In the manufacturing processes described above, if the first insulating film IF1 is formed directly on the third insulating film IF3 without the second insulating film IF2, it is difficult to stop the etching of the first insulating film IF1 at the timing when the third insulating film IF3 is exposed. In other words, the first insulating film IF1 and the third insulating film IF3 both include nitrogen (N); therefore, it is difficult to provide an etching condition with the large selectivity of the etching between the first insulating film IF1 and the third insulating film IF3. Accordingly, the first insulating film IF1 and the third insulating film IF3 are continuously etched; and the etching may stop at a timing when the first portion 30a of the third conductor 30 is exposed.

In such an etching process, the etching time is controlled so that the etching is stopped at the timing when the first portion 30a of the third conductor 30 is exposed at the bottom surface of the contact hole CH over the entire surface of the wafer. Therefore, some of the first portions 30a are exposed for longer times to the etching atmosphere of the first and third insulating films IF1 and IF3 due to the nonuniformity of the etching in the wafer surface. As a result, the first portion 30a is etched, and residue that includes components of the first portion 30a remains, for example, inside the chamber of the etching apparatus.

The first portion 30a of the third conductor 30 includes, for example, copper (Cu). Therefore, there are cases where etching residue that includes Cu remains inside the chamber and causes discrepancies such as deactivation of the etching gas, etc. To avoid such discrepancies, the chamber cleaning for removing the etching residue is performed frequently and reduces the manufacturing efficiency.

In the manufacturing processes of the isolator 100, it is possible to stop the etching of the first insulating film IF1 at the timing when the second insulating film IF2 is exposed; and subsequently, the remaining portion of the second insulating film IF2 and the third insulating film IF3 are selectively etched. Thereby, the time that the first portion 30a of the third conductor 30 is exposed to the etching atmosphere can be shortened. Thus, the etching residue that includes the components of the first portion 30a can be reduced, and the interval between the chamber cleaning can be lengthened.

The time that the first portion 30a of the third conductor 30 is exposed to the etching atmosphere can be shortened by, for example, shortening the etching time of the third insulating film IF3. In other words, the third film thickness T3 of the third insulating film IF3 is preferably less than the second film thickness T2 of the second insulating film IF2. Considering the etching rate difference, the ratio (T2/T3) of the second film thickness T2 and the third film thickness T3 is preferably at least 5. Also, the ratio of the first film thickness T1 and the second film thickness T2 is provided proportionally to the etching rate difference. The film thickness ratio (T1/T2) is preferably about 2.

Figure 5:
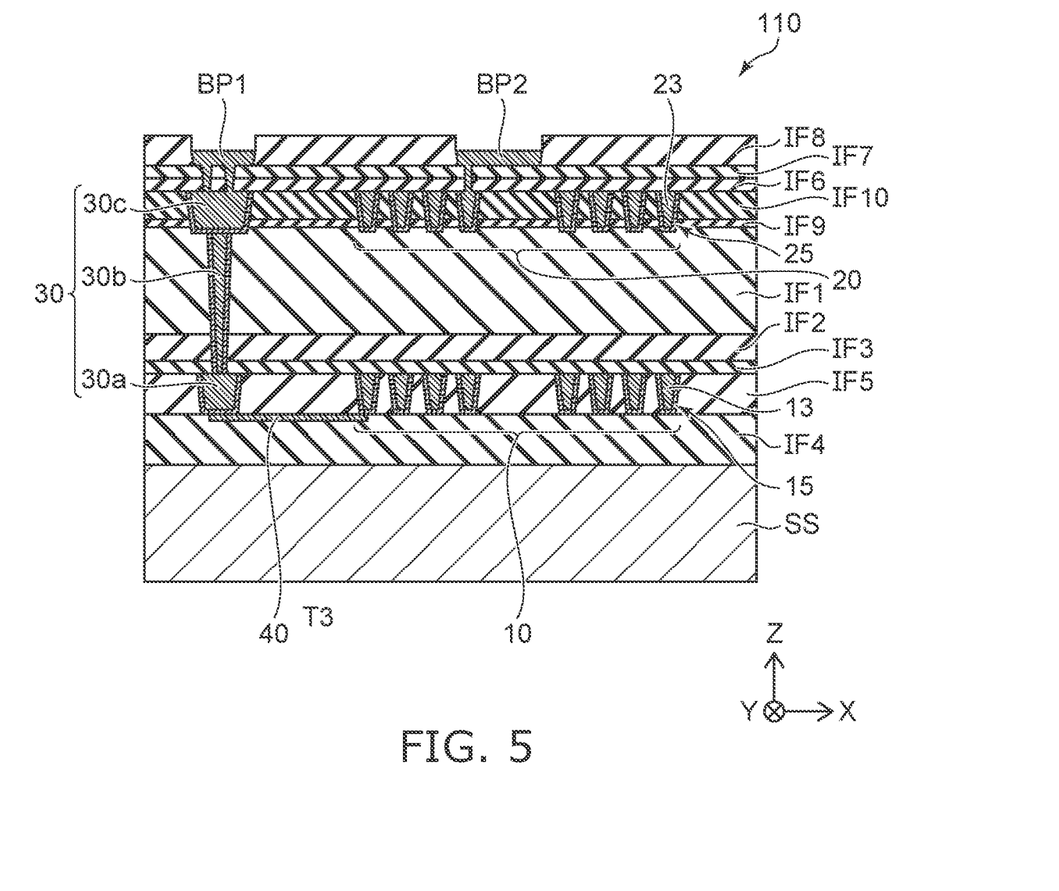
FIG. 5 is a schematic cross-sectional view showing an isolator according to a modification of the embodiment.

FIG. 5 is a schematic cross-sectional view showing an isolator 110 according to a modification of the embodiment.

As shown in FIG. 5, the isolator 110 further includes a ninth insulating film IF9 and a tenth insulating film IF10.

The ninth insulating film IF9 is provided between the first insulating film IF1 and the sixth insulating film IF6. The ninth insulating film IF9 is, for example, a silicon nitride film. The ninth insulating film IF9 has a film thickness in the Z-direction that is less than the first film thickness T1 of the first insulating film IF1 (referring to FIG. 1).

The tenth insulating film IF10 is provided between the ninth insulating film IF9 and the sixth insulating film IF6. The tenth insulating film IF10 has a film thickness in the Z-direction that is less than the first film thickness T1 of the first insulating film IF1. The tenth insulating film IF10 includes a material that has a larger etching selectivity with respect to the material of the ninth insulating film IF9. The tenth insulating film IF10 is, for example, a silicon oxide film.

In the example, the second conductor 20 is provided in the ninth and tenth insulating films IF9 and IF10. For example, the second conductor 20 is provided inside a trench that has a depth reaching the first insulating film IF1 from the upper surface of the tenth insulating film IF10.

For example, the ninth insulating film IF9 is used as an etching-stop film when the tenth insulating film IF10 is partially removed in the process of forming the second conductor 20. The ninth insulating film IF9 is etched after forming the trench from the upper surface of the tenth insulating film IF10 to the ninth insulating film IF9. The thickness in the Z-direction of the ninth insulating film IF9 is less than the thickness in the Z-direction of the tenth insulating film IF10. Thereby, it is possible to make the control of the lower end position of the second conductor 20 easier.

The lower end of the second conductor 20, for example, is positioned at a lower level than the boundary between the first insulating film IF1 and the ninth insulating film IF9. In other words, the distance between the first conductor 10 and the lower end of the second conductor 20 is less than the distance between the first conductor 10 and the ninth insulating film IF9. The insulating films between the first conductor 10 and the second conductor 20 may have a relaxed stress, thereby.

The third portion 30c of the third conductor 30 is formed similarly to the second conductor 20. That is, the third portion 30c is provided in the ninth and tenth insulating films IF9 and IF10. The lower end of the third portion 30c is positioned at a lower level than the boundary between the first insulating film IF1 and the ninth insulating film IF9.

Figure 6:
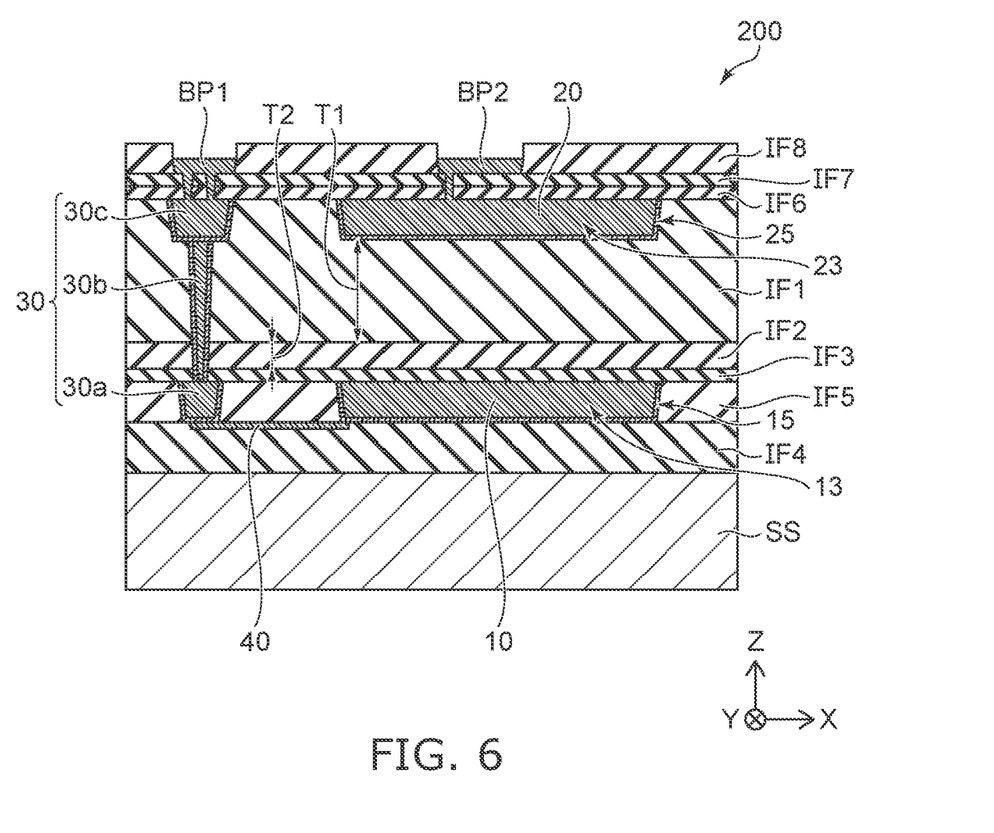
FIG. 6 is a schematic cross-sectional view illustrating an isolator according to another modification of the embodiment.

FIG. 6 is a schematic cross-sectional view illustrating an isolator 200 according to another modification of the embodiment. The first and second conductors 10 and 20 of the isolator 200 each have flat plate shapes that face each other. The second conductor 20 is electrically insulated from the first conductor 10 by the first, second, and third insulating films IF1, IF2, and IF3.

For example, the first conductor 10 and the second conductor 20 may be circular, elliptical, or polygonal when the isolator 200 is viewed in the Z-direction. For example, the first conductor 10 and the second conductor 20 are provided so that the upper surface of the first conductor 10 is parallel to the lower surface of the second conductor 20.

The isolator 200 transmits a signal by utilizing the change of an electric field instead of the change of a magnetic field. When the potential of the first conductor 10 (the input side) is changed by the first circuit 50, for example, the charge amount induced in the second conductor 20 (the output side) is changed. Thereby, the charge flow is induced between the second conductor 20 and the second circuit 60. The second circuit 60 detects the voltage due to the charge flow and generates a signal based on the detection result. Thereby, it is possible to transmit the signal from the first conductor 10 to the second conductor 20.

Also, in the example, the first insulating film IF1 includes silicon (Si), oxygen (O), and nitrogen (N); the stress of the first insulating film IF1 can be reduced; and the warp of the wafer can be suppressed. By using a second insulating film IF2 that include no nitrogen (N) or has a composition ratio of nitrogen less than the nitrogen composition ratio in the first insulating film IF1, the etching residue in the manufacturing processes of the isolator 200 can be reduced, and the manufacturing efficiency can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An isolator, comprising:
  a first conductor;
  a second conductor facing the first conductor;
  a first insulating film provided between the first conductor and the second conductor, the first insulating film having a first film thickness in a first direction directed from the first conductor toward the second conductor, the first insulating film including silicon, oxygen, and nitrogen;
  a second insulating film provided between the first conductor and the first insulating film, the second insulating film having a second film thickness in the first direction, the second film thickness being less than the first film thickness of the first insulating film, the second insulating film including silicon and oxygen, the second insulating film including no nitrogen, or the second insulating film further including nitrogen of a smaller composition ratio than a nitrogen composition ratio in the first insulating film;
  a third insulating film provided between the first conductor and the second insulating film, the third insulating film having a third film thickness in the first direction, the third film thickness being less than the first film thickness of the first insulating film, the third insulating film having a different composition from the compositions of the first and second insulating films;
  a substrate arranged with the first and second conductors in the first direction, the first conductor being provided between the substrate and the second conductor;
  a fourth insulating film provided between the substrate and the first conductor; and
  a fifth insulating film provided between the third insulating film and the fourth insulating film,
  the first conductor being provided in the fifth insulating film.

2. The isolator according to claim 1, wherein the fifth insulating film includes silicon oxide.

3. The isolator according to claim 1, further comprising:
  wiring provided at a boundary between the fourth insulating film and the fifth insulating film, the wiring being electrically connected to the first conductor;

a third conductor provided in the first, second, third, and fifth insulating films, the third conductor extending in the first direction at a position apart from the first and second conductors and being connected to the wiring; and a first bonding pad electrically connected to the third conductor.

4. An isolator, comprising:

a first conductor;

a second conductor facing the first conductor;

a first insulating film provided between the first conductor and the second conductor, the first insulating film having a first film thickness in a first direction directed from the first conductor toward the second conductor, the first insulating film including silicon, oxygen, and nitrogen;

a second insulating film provided between the first conductor and the first insulating film, the second insulating film having a second film thickness in the first direction, the second film thickness being less than the first film thickness of the first insulating film, the second insulating film including silicon and oxygen, the second insulating film including no nitrogen, or the second insulating film further including nitrogen of a smaller composition ratio than a nitrogen composition ratio in the first insulating film;

a third insulating film provided between the first conductor and the second insulating film, the third insulating film having a third film thickness in the first direction, the third film thickness being less than the first film thickness of the first insulating film, the third insulating film having a different composition from the compositions of the first and second insulating films;

a sixth insulating film covering the second conductor, the second conductor being provided between the first insulating film and the sixth insulating film;

a first intermediate insulating film provided between the first insulating film and the sixth insulating film, the first intermediate insulating film including a different material from the first insulating film; and a second intermediate insulating film provided between the first intermediate insulating film and the sixth insulating film, the second intermediate insulating film including a different material from the first intermediate insulating film, the second conductor being provided in the first and second intermediate insulating films, a distance between the first conductor and the second conductor being less than a distance between the first conductor and the first intermediate insulating film.

5. The isolator according to claim 4, wherein the sixth insulating film includes silicon nitride, the first intermediate insulating film includes silicon nitride, and the second intermediate insulating film includes silicon oxide.

6. The isolator according to claim 4, further comprising:

a seventh insulating film covering the sixth insulating film, the seventh insulating film having a different composition from a composition of the sixth insulating film; and a second bonding pad provided on the seventh insulating film, the second bonding pad being electrically connected to the second conductor through a contact hole provided in the sixth and seventh insulating films.

7. The isolator according to claim 6, wherein the seventh insulating film includes silicon oxide.

* * * * *